(12) United States Patent
Hart et al.

(10) Patent No.: US 7,089,527 B2
(45) Date of Patent: *Aug. 8, 2006

(54) STRUCTURES AND METHODS FOR SELECTIVELY APPLYING A WELL BIAS TO PORTIONS OF A PROGRAMMABLE DEVICE

(75) Inventors: Michael J. Hart, Palo Alto, CA (US); Steven P. Young, Boulder, CO (US); Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 193 days.

This patent is subject to a terminal disclaimer.

(21) Appl. No.: 10/853,982

(22) Filed: May 25, 2004

(65) Prior Publication Data

US 2004/0216074 A1   Oct. 28, 2004

Related U.S. Application Data

(62) Division of application No. 10/624,617, filed on Jul. 21, 2003, now Pat. No. 6,777,978, which is a division of application No. 09/956,203, filed on Sep. 18, 2001, now Pat. No. 6,621,325.

(51) Int. Cl.
*G06F 17/50* (2006.01)
(52) U.S. Cl. .......................................... 716/17; 716/16
(58) Field of Classification Search ................. 716/17, 716/16, 1; 326/38; 327/534
See application file for complete search history.

(56) References Cited

U.S. PATENT DOCUMENTS

| | | | |
|---|---|---|---|
| 5,448,198 A | 9/1995 | Toyoshima et al. | |
| 5,461,338 A | 10/1995 | Hirayama et al. | |
| 5,487,033 A | 1/1996 | Keeney et al. | |
| 5,661,685 A | 8/1997 | Lee et al. | |
| 5,703,522 A | 12/1997 | Arimoto et al. | |
| 5,825,707 A | 10/1998 | Nozawa et al. | |
| 5,880,620 A | 3/1999 | Gitlin et al. | |
| 5,929,695 A * | 7/1999 | Chan et al. | 327/537 |
| 6,055,655 A * | 4/2000 | Momohara | 714/723 |
| 6,369,630 B1 | 4/2002 | Rockett | |
| 6,604,228 B1 * | 8/2003 | Patel et al. | 716/8 |
| 6,630,838 B1 | 10/2003 | Wong | |

OTHER PUBLICATIONS

Nose, K. et al.; "$V_{TH}$-hopping Scheme for 82% Power Saving in Low-Voltage Processors"; Proceedings of the IEEE 2001 Custom Integrated Circuits Conference; May 6-9, 2001; pp. 93-96.

(Continued)

*Primary Examiner*—Sun James Lin
(74) *Attorney, Agent, or Firm*—Lois D. Cartier

(57) ABSTRACT

Structures and methods for selectively applying a well bias to only those portions of a PLD where such a bias is necessary or desirable, e.g., applying a positive well bias to transistors on critical paths within a user's design. A substrate for an integrated circuit includes a plurality of wells, each of which can be independently and programmably biased with the same or a different well bias voltage. In one embodiment, FPGA implementation software automatically determines the critical paths and generates a configuration bitstream that enables positive well biasing only for the transistors participating in the critical paths, or only for programmable logic elements (e.g., CLBs or lookup tables) containing those transistors. In another embodiment, negative well biasing is selectively applied to reduce leakage current.

20 Claims, 13 Drawing Sheets

OTHER PUBLICATIONS

Kuroda, T. et al.; "A 0.9 V 150 MHz 10 mW 4mm2-D Discrete Cosine Transform Core Processor with Variable-Threshold-Voltage Scheme"; Solid-State Circuits Conference; 1996; Digest of Technical Papers; 42nd ISSCC; IEEE International; Feb. 8, 1996; pp. 166-167, 437.

Kuroda, T. et al.; "A High-Speed Low-Power 0.3/spl mu/m CMOS Gate Array with Variable Threshold Voltage (VT) Scheme"; Custom Integrated Circuits Conference; 1996; Proceedings of the IEEE 1996; May 5-8, 1996; pp. 53-56.

* cited by examiner

STRUCTURES AND METHODS FOR SELECTIVELY APPLYING A WELL BIAS TO PORTIONS OF A PROGRAMMABLE DEVICE

FIELD OF THE INVENTION

The invention relates to Programmable Logic Devices (PLDs). More particularly, the invention relates to structures and methods for applying a programmable well bias to selected portions of a PLD.

BACKGROUND OF THE INVENTION

Programmable logic devices (PLDs) are a well-known type of digital integrated circuit that may be programmed by a user to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a programmable interconnect structure. Some FPGAs also include additional logic blocks with special purposes (e.g., DLLs, RAM, and so forth).

The CLBs, IOBs, interconnect, and other logic blocks are typically programmed by loading a stream of configuration data (bitstream) into internal configuration memory cells that define how the CLBs, IOBs, and interconnect are configured. The configuration data may be read from memory (e.g., an external PROM) or written into the FPGA by an external device. The collective states of the individual memory cells then determine the function of the FPGA.

In a PLD, as in other integrated circuits (ICs), the various CLBs, IOBs, and interconnect are formed on a single substrate. FIG. 1A shows a first silicon substrate on which NMOS 101 and PMOS 102 transistors are formed. The silicon substrate 100 is positively doped (P-type). Therefore, to form a PMOS transistor, an "IN-well" (negatively doped region) 112 is diffused into substrate 100, and the PMOS transistor 102 is formed within N-well 112.

FIG. 1B shows a second silicon substrate for a CMOS integrated circuit (IC) formed using a "triple-well" process. When the triple-well process is used, NMOS transistors 101 are formed within "P-wells" (positively doped regions) 111, within larger N-wells 113, which in turn reside within P-type substrate 100. Similarly, all PMOS transistors 102 are formed within N-wells 112, which also reside within P-type substrate 100. Thus, the P-wells 111 and N-wells 112 are electrically isolated, both from each other and from all other wells in the substrate.

FIG. 1C shows a third silicon substrate formed using an "SOI", or silicon-on-insulator, process. When an SOI process is used, NMOS transistors 101 are formed within P-wells 111, and PMOS transistors 102 are formed within N-wells 112. Each of P-wells 111 and N-wells 112 reside within an electrically insulating substrate 110. Thus, the substrate insolates the P-wells and N-wells from each other and from all other wells in the substrate.

Over time, IC designers are reducing the "VCC" or power high voltage level at which ICs are designed to operate. This reduction in VCC has the advantage of reducing power consumption in an IC. However, it also has the undesirable effect of reducing performance in the IC. Therefore, it is desirable to find ways to counteract this decrease in performance. One method is to apply a voltage bias to the wells in which the transistors reside.

When either a triple-well or an SOI process is used, the P-wells and N-wells can be biased to voltage levels different from each other and from other wells of the same type. An applied voltage differential is referred to as a "substrate bias" or (when applied to a well) a "well bias".

FIGS. 1B and 1C shows examples of the application of well biasing to P-wells and N-wells. For example, for an NMOS transistor 101, a positive well bias 105 of about 0.4 to 0.6 volts can be applied to P-well 111. In other words, if P-well 111 is normally at ground (0 volts), the P-well is driven to about 0.4 to 0.6 volts.

Similarly, for a PMOS transistor 102 a positive well bias 106 of about −0.4 to −0.6 volts can be applied to an N-well 112. In other words, the so-called "positive well bias" drives the N-well to a negative voltage relative to the original voltage level. For example, for a PMOS transistor 102, if the N-well is normally at VCC (power high), the N-well is driven to about VCC−0.4 to VCC−0.6 volts.

As the term is used herein, applying a more positive voltage to a P-well or a more negative voltage to an N-well is called applying a "positive well bias". Thus, applying a positive well bias effectively reduces the reverse well bias of the transistors within the well. Also as used herein, applying a more negative voltage to a P-well or a more positive voltage to an N-well is called applying a "negative well bias". Thus, applying a negative well bias effectively increases the reverse well bias of the transistors within the well.

By changing the voltage level of a well, the threshold voltage (Vt) of the transistors within the well is altered. For example, an increased positive voltage in a P-well (i.e., a positive well bias) causes a drop in the threshold voltage of the NMOS transistors within the well. This lower threshold voltage, in turn, increases the saturation drain current, which increases the performance of all of the NMOS transistors within the biased well.

The reverse situation is also true. For example, a lower voltage in a P-well (i.e., a negative well bias) causes a rise in the threshold voltage of the NMOS transistors within the well, resulting in a reduced leakage current. Gitlin et al. describe one example of using a negative well bias to reduce leakage current in U.S. Pat. No. 5,880,620, entitled "Pass Gate Circuit with Body Bias Control", which is hereby incorporated by reference. However, the application of a negative well bias also has the effect of reducing the performance of the transistor.

While the application of a positive well bias increases the performance of a transistor, the faster operation has its price. Besides increasing the saturation drain current, the positive well bias also increases the amount of current flowing through an inactive transistor. This current is a major component of leakage current in a CMOS integrated circuit (IC). Therefore, applying a positive well bias to all the transistors on an IC certainly improves the performance of the device, but can also lead to an unacceptably large leakage current.

To address this limitation, "fixed function" logic devices (as opposed to programmable logic devices, or PLDs) can be designed with positive well bias applied only to circuits that are particularly speed-critical. By applying this technique, the speed advantage is gained only where necessary, while the increase in leakage current is kept within acceptable bounds.

However, the problem of increased leakage current with an applied positive well bias is not so easily addressed in PLDS. In PLDs, the critical circuits and paths are not limited to specific areas of the device or to specific transistors. For example, in an FPGA, a user can program any of the CLBs to perform a speed-critical function, and a path between two such CLBs can traverse any of a large number of interconnect paths. Therefore, in the past, to take advantage of positive well biasing in a PLD would have required the well biasing of each transistor in the programmable areas of the device, to ensure that the critical paths used the biased transistors. As PLDs increase in size, to the point where many millions of transistors are used in each PLD, leakage currents are becoming a limiting factor in many designs. Therefore, it has not been possible to take advantage of positive well biasing in the design of large PLDs.

It is therefore desirable to provide structures and methods enabling the application of well biasing techniques to large PLDS.

SUMMARY OF THE INVENTION

The invention provides a substrate for an integrated circuit that includes a plurality of wells, each of which can be independently and programmably biased with the same or a different well bias voltage.

In some embodiments the integrated circuit is a programmable logic device (PLD) such as a field programmable gate array (FPGA). In one such embodiment, the bias for each well or group of wells is programmably applied from a bias generator circuit through a pass transistor controlled by a programmable memory cell. The programmable memory cells are programmed using the same configuration bitstream that controls the programming of the CLBs, IOBs, and interconnect in the FPGA. The FPGA is divided into two or more portions wherein the well biasing is separately controlled. The FPGA portions can comprise lookup tables, individual transistors such as pass transistors, multiplexers, entire CLBs, or any other portions of the device.

In some embodiments, a plurality of well bias voltage levels are provided. Values stored in two or more SRAM cells are decoded to select one of the plurality of well bias values for each well.

Another aspect of the invention provides methods for selectively applying a well bias to only those portions of a PLD where such a bias is necessary or desirable, e.g., applying a positive well bias only to transistors on critical paths within a user's design.

According to one embodiment of the invention, an FPGA user defines the critical paths in his or her design at the time the user circuit is defined. The FPGA implementation software (software that accepts a design description and generates a configuration bitstream implementing the described design in an FPGA) takes note of the designated critical paths and generates a configuration bitstream that enables positive well biasing only for the transistors participating in the critical paths, or only for programmable logic elements (e.g., CLBs or lookup tables) containing those transistors.

In another embodiment, the FPGA implementation software includes timing software (such as is well known in the art) that automatically determines the critical paths in the user's design. The software then enables positive well biasing for transistors on these determined critical paths.

In one embodiment, the FPGA implementation software monitors the number of transistors having an applied positive well bias, and issues an error message if the number of these transistors is such that the specified maximum leakage current for the device will be exceeded.

In another embodiment, negative well biasing voltage levels are programmably provided. In other words, a P-well can be programmably biased to a lower voltage, and an N-well can be programmably biased to a higher voltage. This negative well biasing leads to decreased performance of transistors within the well, and concomitant decreased leakage current. In one such embodiment, the FPGA implementation software compensates for an otherwise unacceptably large number of positively well biased transistors by negatively well biasing transistors in non-critical paths. In one embodiment, the user specifies these non-critical paths. In another embodiment, the FPGA implementation software automatically determines the least critical paths in the user's design.

In another embodiment, negative well biasing is used to reduce leakage current on non-critical paths, while no positive well biasing occurs.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

The present invention is applicable to a variety of programmable logic devices (PLDs). The present invention has been found to be particularly applicable and beneficial for field programmable gate arrays (FPGAs). While the present invention is not so limited, an appreciation of the present invention is presented by way of specific examples, in this instance with an FPGA programmed using SRAM cells.

In the following description, numerous specific details are set forth to provide a more thorough understanding of the present invention. However, it will be apparent to one skilled in the art that the present invention may be practiced without these specific details.

Circuit Configurations

Well biasing can be used to increase transistor performance (positive well biasing) or decrease leakage current (negative well biasing). FIGS. 2A–2F show various silicon substrates and exemplary biasing configurations that can be used in accordance with the various embodiments of the present invention.

Figure 1A:
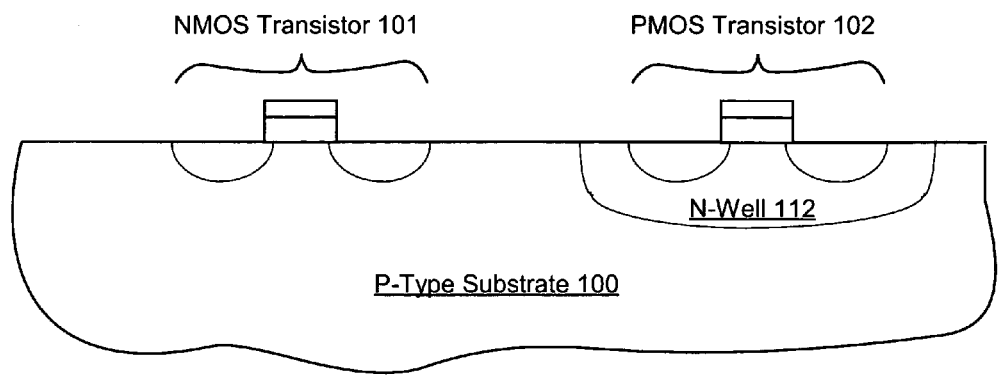
FIG. 1A shows the substrate of an exemplary CMOS integrated circuit.
Figure 1B:
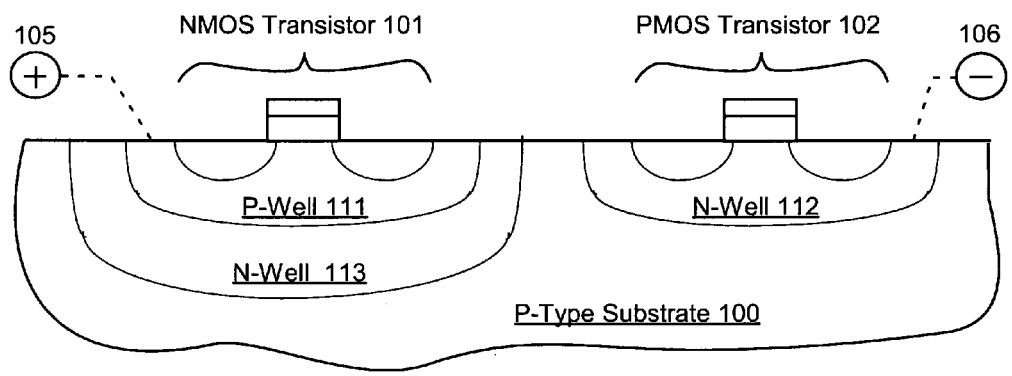
FIG. 1B shows the substrate of an exemplary CMOS integrated circuit using a triple-well process.
Figure 2A:
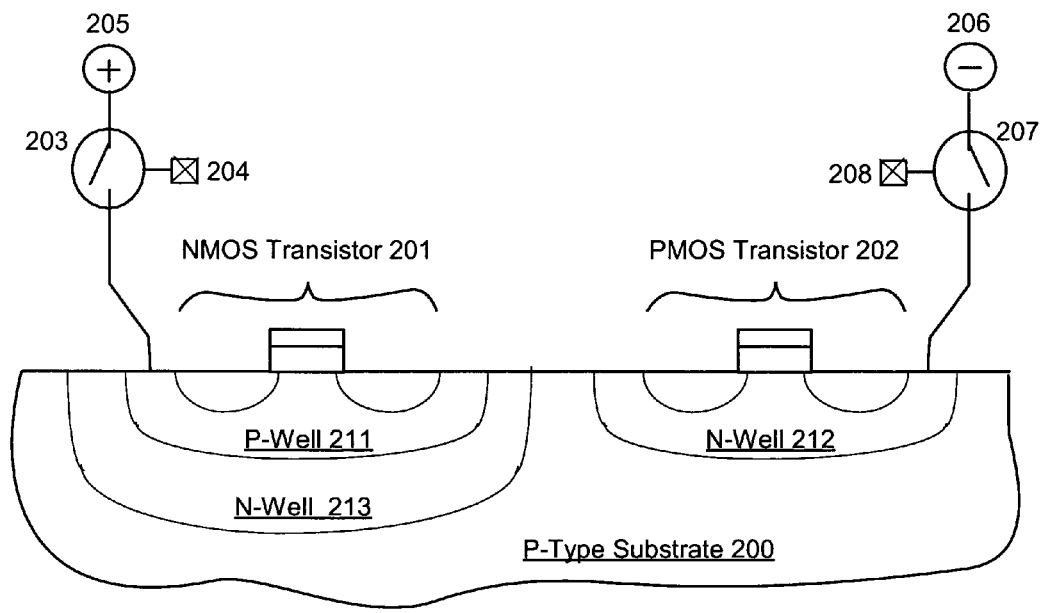
FIGS. 2A–2H show exemplary silicon substrates to which programmable well biasing is applied in accordance with various embodiments of the invention.

FIG. 2A shows a first silicon substrate to which a programmable well bias is applied. The silicon substrate 200 and the various structures formed thereon are similar to those of FIG. 1B, which is formed using a triple-well process. In the example of FIG. 2A, a positive well bias 205 can be selectively applied to P-well 211 by way of switch 203. Switch 203 is controlled by programmable memory cell 204. In one embodiment, switch 203 is an NMOS passgate, while memory cell 204 is a configuration memory cell in an FPGA.

Also in FIG. 2A, a positive well bias 206 can be selectively applied to N-well 212 (i.e., a more negative voltage is applied to the N-well) by way of switch 207. Switch 207 is controlled by programmable memory cell 208. In one embodiment, switch 207 is a PMOS passgate, while memory cell 208 is a configuration memory cell in an FPGA.

Bias generator circuits such as those labeled 205 and 206 in FIG. 2A (and those shown in FIGS. 2C–2H) are well known in the art, and therefore are not described in detail here.

In the embodiment of FIG. 2A, switches 203, 207 and bias generator circuits 205, 206 are also implemented within substrate 200. However, in other embodiments, a well bias is externally provided.

Figure 1C:
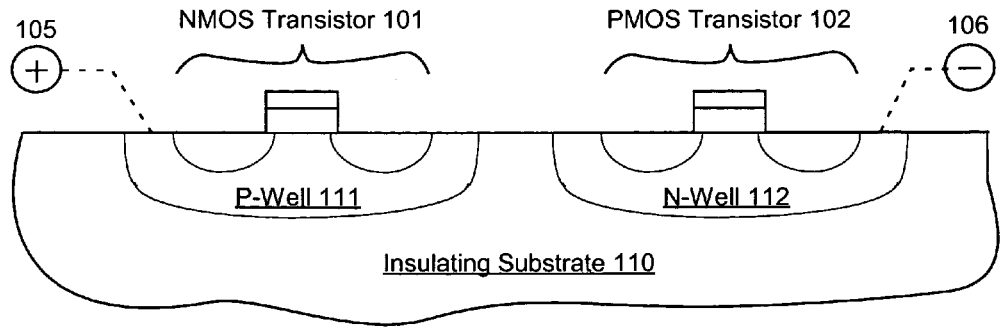
FIG. 1C shows the substrate of an exemplary CMOS integrated circuit using an SOI (silicon-on-insulator) process.
Figure 2B:
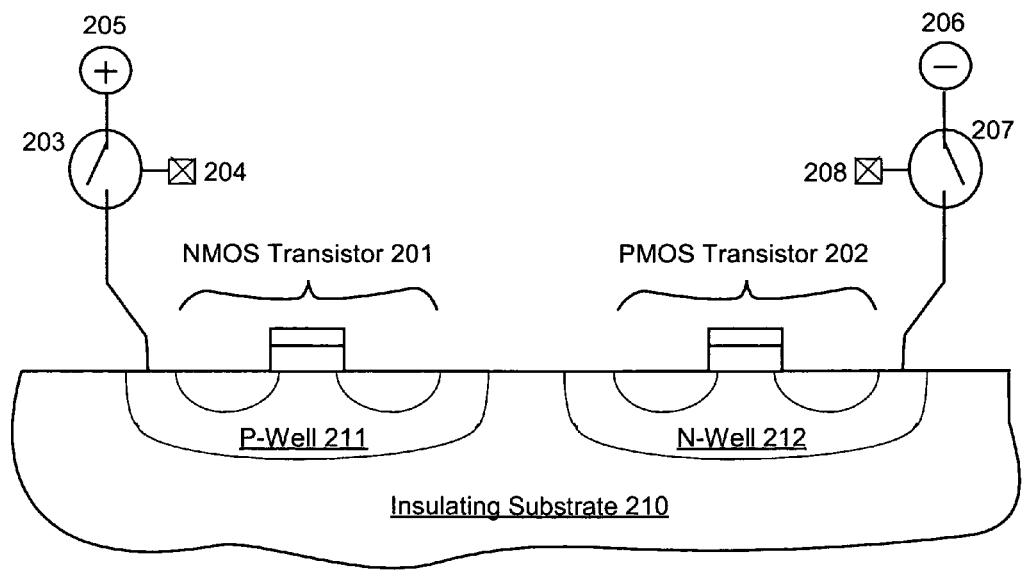

FIG. 2B shows the same positive well biasing configuration implemented using an SOI substrate similar to that of FIG. 1C.

Figure 2C:
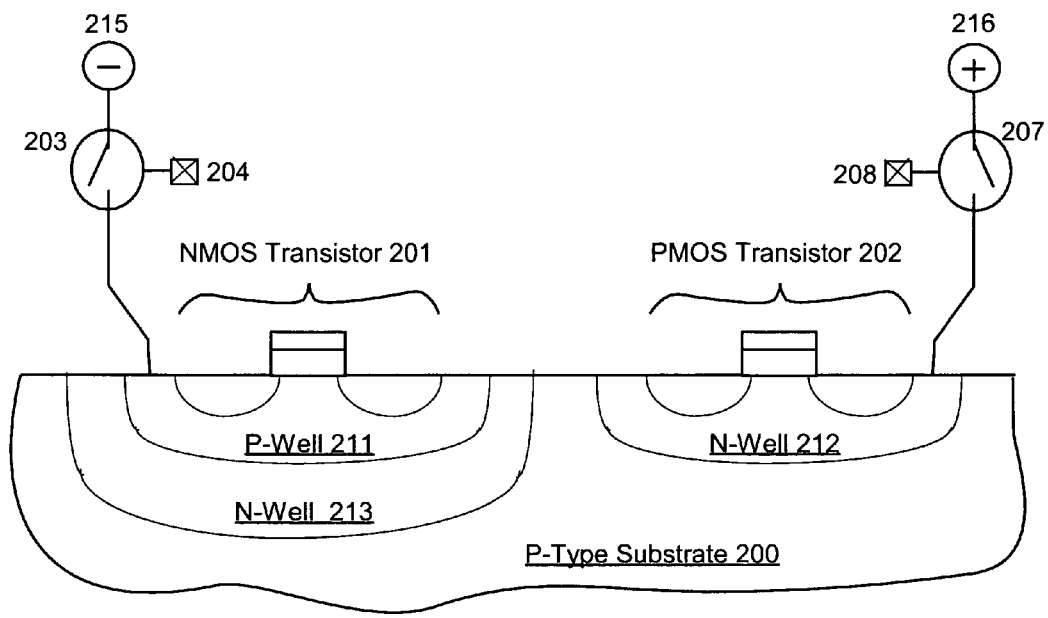

FIG. 2C shows the application of negative well biasing to P-wells and N-wells. In the example of FIG. 2C, a negative well bias 215 can be selectively applied to P-well 211 by way of switch 203. Switch 203 is controlled by programmable memory cell 204. Similarly, a negative well bias 216 can be selectively applied to N-well 212 (i.e., a more positive voltage is applied to the N-well) by way of switch 207. Switch 207 is controlled by programmable memory cell 208.

Figure 2D:
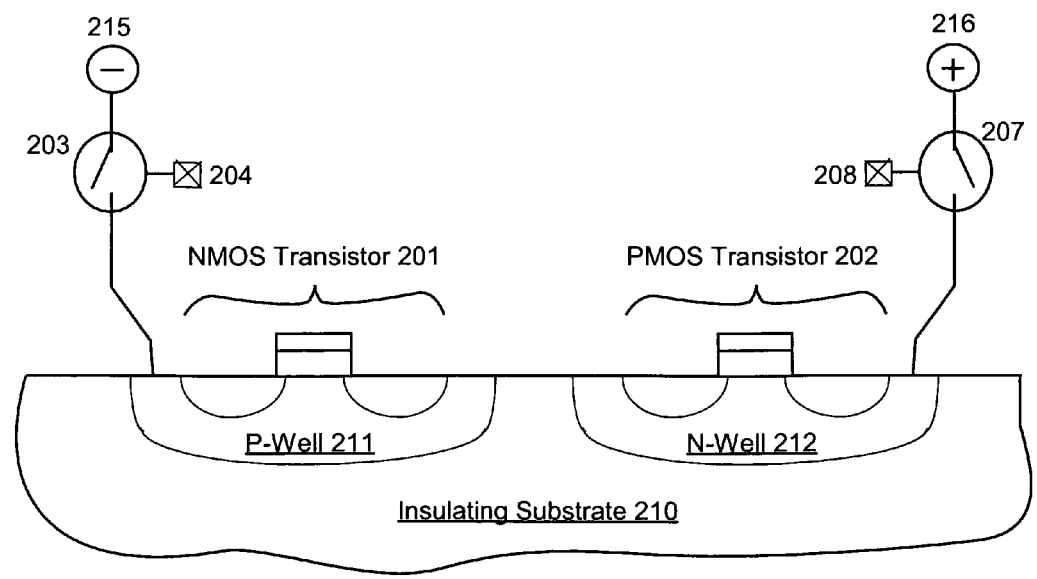

FIG. 2D shows the same negative well biasing configuration implemented using an SOI substrate similar to that of FIG. 1C.

Figure 2E:
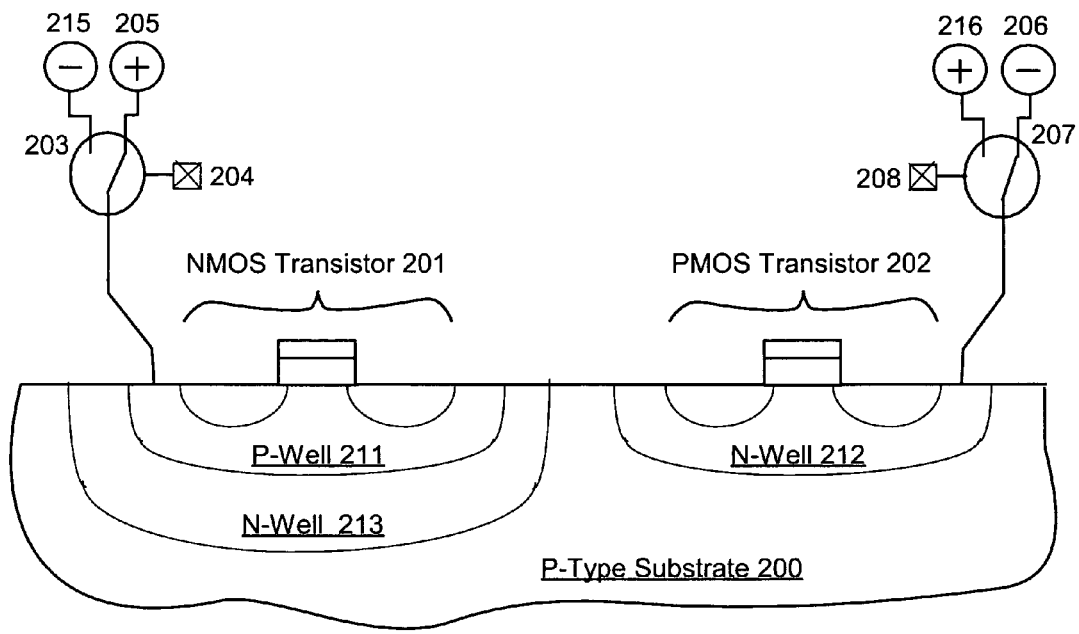

FIG. 2E shows another configuration of the triple-well substrate of FIG. 1B, wherein a programmable selection is made between positive well biasing or negative well biasing.

Figure 2F:
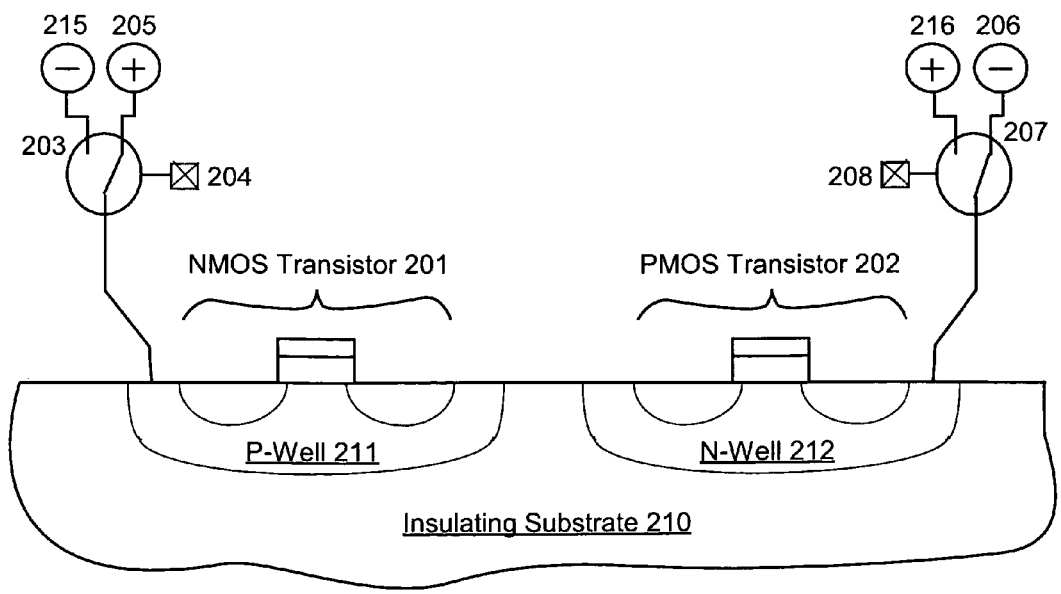

FIG. 2F shows the same configuration applied to an SOI substrate.

Figure 2G:
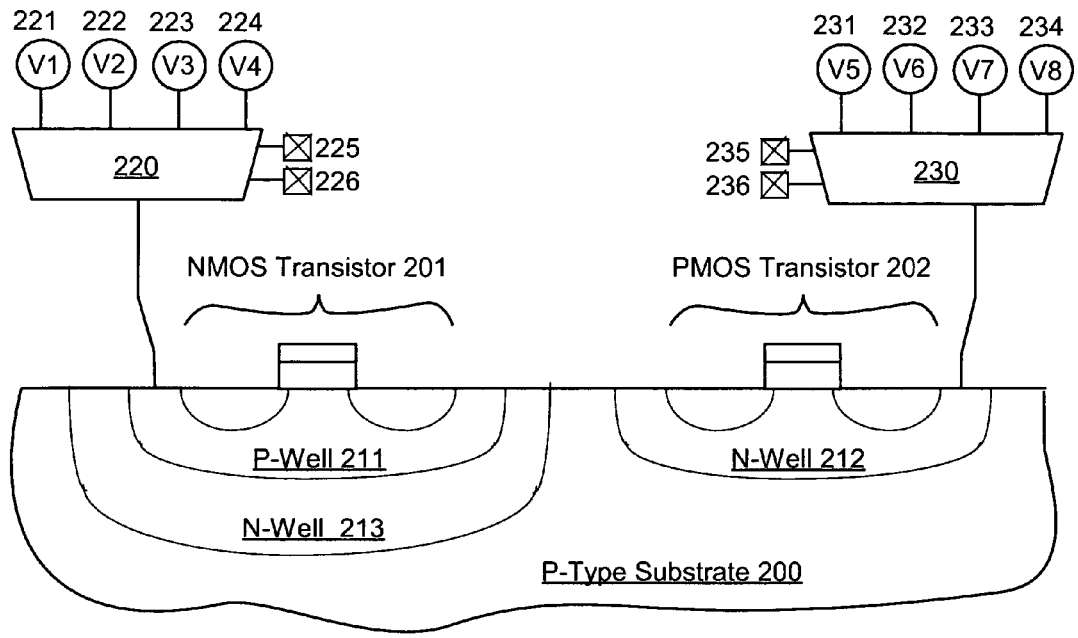

FIG. 2G shows another configuration of the triple-well substrate of FIG. 1B, wherein a programmable selection is made between four different well bias voltages provided by well bias voltage generators 221–224. For NMOS transistor 201, the selection is made via multiplexer 220, which is controlled by two programmable memory cells 225 and 226. Note that in this embodiment, the switch circuit is implemented as a multiplexer, rather than being implemented as an NMOS or PMOS passgate as in the embodiments of FIGS. 2A–2F. For example, the multiplexer can be implemented as a plurality of passgates in parallel. There are many well known types of switch circuits that can be used to implement the invention. In addition, the switch circuits can be controlled by means other than programmable memory cells. For example, the switch circuits can be controlled by flip-flops, where the flip-flops are driven by other programmable logic within the user circuit. Thus, the switch circuits can be dynamically controlled, provided that sufficient time is allowed for the well bias to be applied. Many other types of switch controls can also be used.

The four bias voltages V1–V4 can be all positive well bias voltages, all negative, a mixture, and so forth. One of the four well bias voltages can be a zero bias, in which case one of well bias voltage generators 221–224 can be omitted. For PMOS transistor 202, the selection is made via multiplexer 230, which is controlled by two programmable memory cells 235 and 236. The four bias voltages V5–V8 can be the same as, or different from, the four bias voltages V1–V4.

Figure 2H:
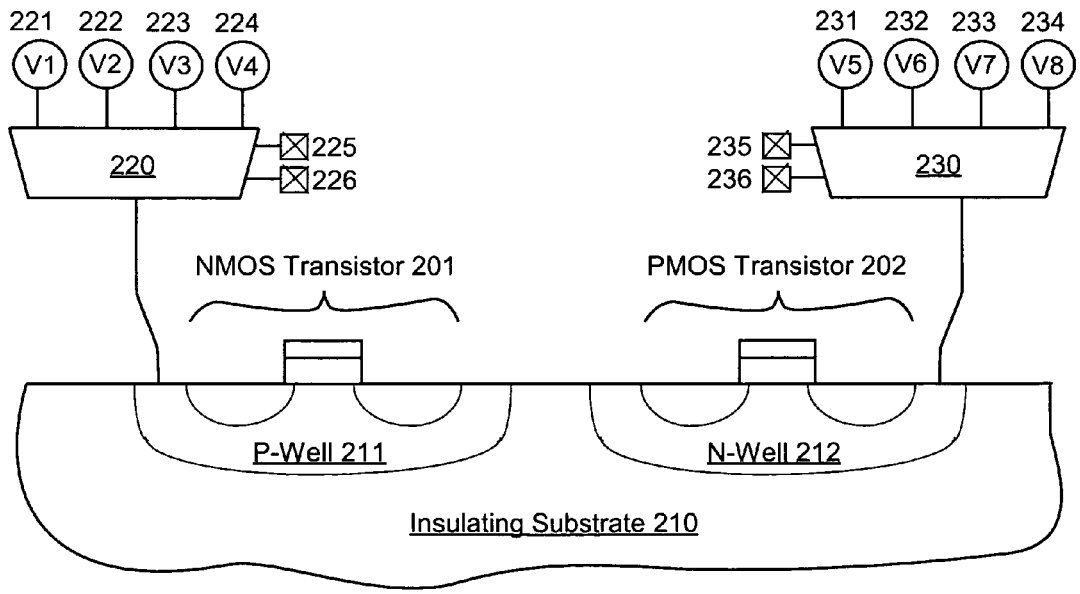

FIG. 2H shows the same configuration applied to an SOI substrate.

Many other configurations are possible. For example, a single memory cell can serve to control multiple switches. For example, memory cells 204 and 208 in FIGS. 2A–2F can be the same memory cell. Similarly, memory cells 225 and 226 can be the same as memory cells 235 and 236.

Exemplary User Circuit

Figure 3:
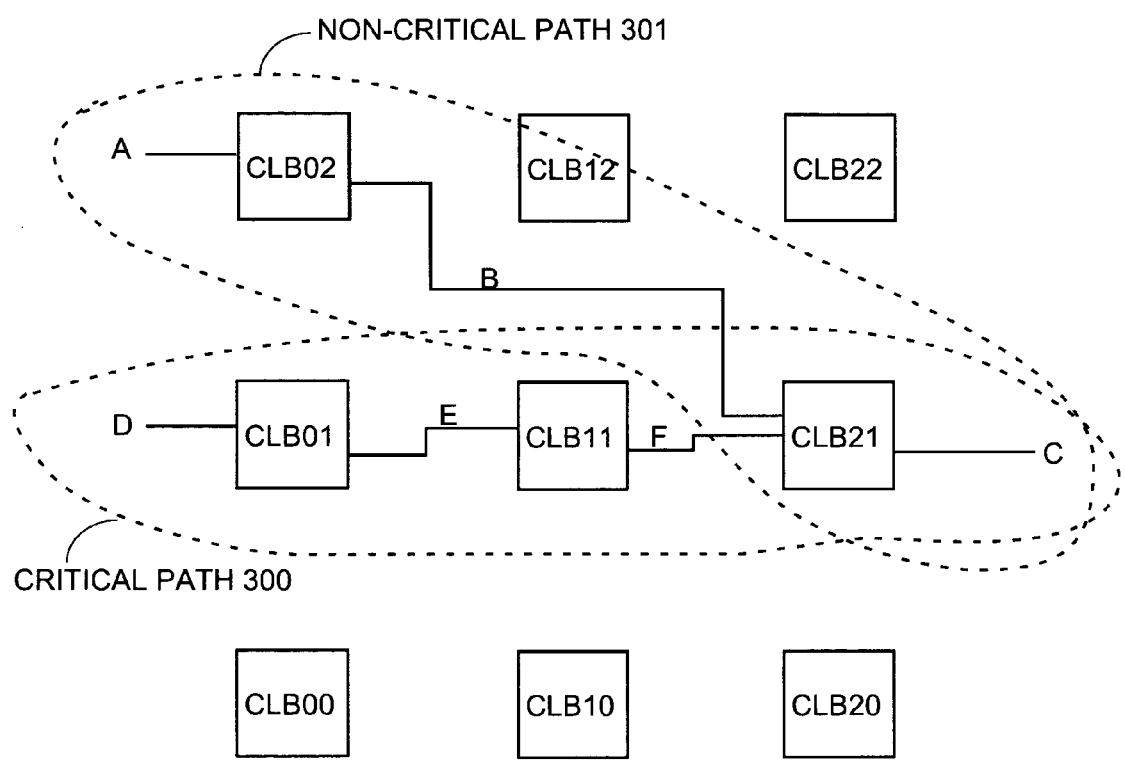
FIG. 3 shows a user circuit implemented in several configurable logic blocks (CLBs) of an FPGA.

FIG. 3 shows the logic elements of an FPGA in which user logic has been mapped and placed. "Mapping" is the grouping of specific portions of a user's logic circuit into sets that will fit into logic elements in the FPGA. "Placement" is the assignment of a set to a specific logic element in a specific location within the FPGA.

In FIG. 3, the pictured logic elements are configurable logic blocks, or CLBs, arranged in a regular array. The simple example of user logic shown in FIG. 3 includes four logic sets placed in CLBs CLB02, CLB01, CLB11, and CLB21. There are two paths through the circuit. A first path 301 extends from node A through CLB02 to node B, and hence through CLB21 to node C. A second path 300 extends from node D through CLB01 to node E, through CLB11 to node F, and through CLB21 to node C. In this example, the logic in each of the CLBs traverses only one lookup table, except for in CLB21, wherein the lookup table output value is stored in a flip-flop, and the flip-flop output is placed on node C.

Because the second path 300 traverses three lookup tables while the first path 301 traverses only two, clearly the second path will take longer to traverse (assuming, for simplicity, that routing delays over these short distances are relatively negligible). Therefore, it is the speed of the second path that determines the overall speed of the user circuit. Hence, the second path is called the "critical path", and the first path is called a "non-critical path".

A critical path can be designated by the user when he or she enters the design description, or this information can be supplied by the user when initiating the FPGA implementation software, or by placing the information in a file, or interactively during implementation, or by some other means. However, this information can also be extracted from the design by the implementation software, thus eliminating the need for user intervention.

For example, it is well known in the art of FPGA software design to extract timing information from a user design before, during, and after implementation, both to optimize the results and to report on the performance of the resulting design. This technique is commonly used, for example, by the FPGA implementation software currently available from Xilinx, Inc.

FPGA implementation software typically performs a series of steps in implementing a user circuit in the FPGA. For example, these steps can include mapping, placement, and routing. Mapping and placement were previously described. "Routing" is the assignment of the various paths to the various programmable interconnect resources available in the FPGA. Timing information (including critical path designations) is commonly used in all three steps. During the mapping step, an effort is made to group logic on critical paths together into a single logic element. During the placement step, as in the example of FIG. 3, logic on the critical path is usually placed such that the physical distance between successive logic sets is minimized. Thus, the routing delay on the critical path is minimized as much as possible, to reduce the impact of this slowest path on the performance of the user circuit. During the routing step, the fastest interconnect resources are assigned to the most critical paths.

In one embodiment, the FPGA implementation software functions as follows. The FPGA is divided into portions, each of which has separately controlled well biasing. For example, in this embodiment each lookup table (LUT) has separately controlled well biasing. Each LUT is modeled as being either fast (with positive well biasing) or slow (without well biasing). There is a cost associated with the fast model. During the placement and/or routing phase, one of the two models is selected based on delay and power constraints. For example, the router can balance the static power consumed by the positively biased well against the dynamic power from all the connections in the system.

In another embodiment, an additional model is provided, the low-power model. The low-power model is associated with LUTs having an applied negative well bias. In another embodiment, several models with various levels of applied bias are used.

The invention provides additional methods of minimizing delays on critical paths. According to one aspect of the present invention, delays on a critical path are minimized by selectively applying a positive well bias to transistors implementing logic on the path. In the user circuit of FIG. 3, for example, a positive well bias can be applied to the entirety of CLBs CLB01, CLB11, and CLB21. Thus, the full speed advantage of the positive well bias is gained (because the limiting path is speeded up as much as possible), but the additional leakage current is limited to the CLBs on the critical path. No well bias is applied to CLBs not on the critical path, for example, CLBs CLB02, CLB12, and so forth.

In another embodiment, a positive well bias is only applied to some of the transistors on the critical path. The path need only be speeded up to the point where the specified timing requirement is met. Therefore, when the timing requirement is met by biasing only a subset of the transistors, only the transistors in that subset are positively biased. This approach minimizes the additional leakage current added by the applied positive biasing.

In some embodiments, there are two or more critical paths. If only some of the transistors on each path need to be positively biased, and some transistors are shared between multiple critical paths, the wells containing the shared transistors are preferably biased first. Then, if timing requirements are not met, additional transistors on each path can be positively biased as needed.

In another embodiment, while a positive well bias is applied to CLBs on the critical path, a negative well bias is applied to CLBs on the slowest path (CLB02) and/or CLBs not used in the user circuit (CLBs CLB12, CLB22, CLB00, CLB10, and CLB20). Thus, the non-critical paths are actually slowed down, reducing leakage current to compensate for the increased leakage current resulting from the positive well bias on the critical paths.

In other embodiments, a well bias is only applied to those portions of the CLB that are actually used by the user circuit. For example, in the circuit of FIG. 3, only lookup tables (LUTs) are used in CLBs CLB02, CLB01, and CLB11, i.e., the flip-flops provided in these CLBs are not used. Therefore, in these CLBs the well bias is only applied to the LUTs in the CLB. In another embodiment, a well bias is also applied to the pass transistors allowing access to and from the LUTs and interconnect. In other embodiments (including those implemented in PLDs having programmable subdivisions other than CLBs and LUTs), a well bias is selectively applied to other groupings of programmable logic.

In one embodiment, a positive well bias is applied to all transistors in the user logic (or a predetermined subset thereof). Thus, a large number of transistors are initially set to their fastest speed. The well bias is then sequentially removed from non-critical transistors while monitoring the projected leakage current. When the projected leakage current falls below a specified value, the positive bias is retained on the remaining biased transistors.

Programmable voltage generators are known in the art of programmable logic design. For example, Lee et al. describe a number of illustrative programmable charge pump circuits in U.S. Pat. No. 5,661,685, entitled "Programmable Logic Device with Configurable Power Supply", which is incorporated herein by reference. Programmable charge pumps are generally designed to be adjustable so that voltage levels can be changed to compensate for process variations during fabrication, which can cause shifts in the output voltage of the charge pumps.

However, a programmable voltage generator can be used to add another level of complexity to the present invention, by providing two or more different well biasing voltages from which to choose. Where several well bias values are available, the FPGA implementation software can calculate by how much the speed of the critical path must be increased, by comparing the difference between the timing delay on the critical path with that of the next slowest path. If only a slight increase in speed is needed, a small well bias can be applied, with its correspondingly slight increase in leakage current. If the critical path is much slower than the next most critical, the strongest available well bias is applied. When the speed of several transistors (or larger FPGA portions) is being adjusted, the implementation software can try various combinations of well bias levels on various transistors and various paths, until the optimal configuration is achieved.

In one embodiment, four positive well bias voltage levels are available for a P-well: 0 volts, +X/3 volts, +2X/3 volts, and +X volts, where X is a positive value. For example, if X=0.6, the four available positive well bias voltage levels are 0 volts, 0.2 volts, 0.4 volts, and 0.6 volts. Of these selections, a positive well bias of 0 volts (i.e., no bias applied) gives the poorest performance but the lowest leakage current, while a positive well bias of 0.6 volts gives the best performance but the highest leakage current. With four selections, the choice is made by programming two memory cells (via the configuration bitstream) with appropriate bit values.

In some embodiments, the available well bias voltage levels are negative well bias levels. For example, for a P-well, the available values can be 0 volts, −X/3 volts, −2X/3 volts, and −X volts, where X is a positive value.

In other embodiments, both positive and negative well biasing are available for a single well. For example, for a P-well, the available values can be −X volts, 0 volts, and +X volts, where X is a positive value.

Illustrative Methods

FIGS. 4–10 show several illustrative methods encompassed by the present invention. These methods are shown and described to demonstrate some applications of the present invention; however, the invention is not limited to the variations shown.

Figure 4:
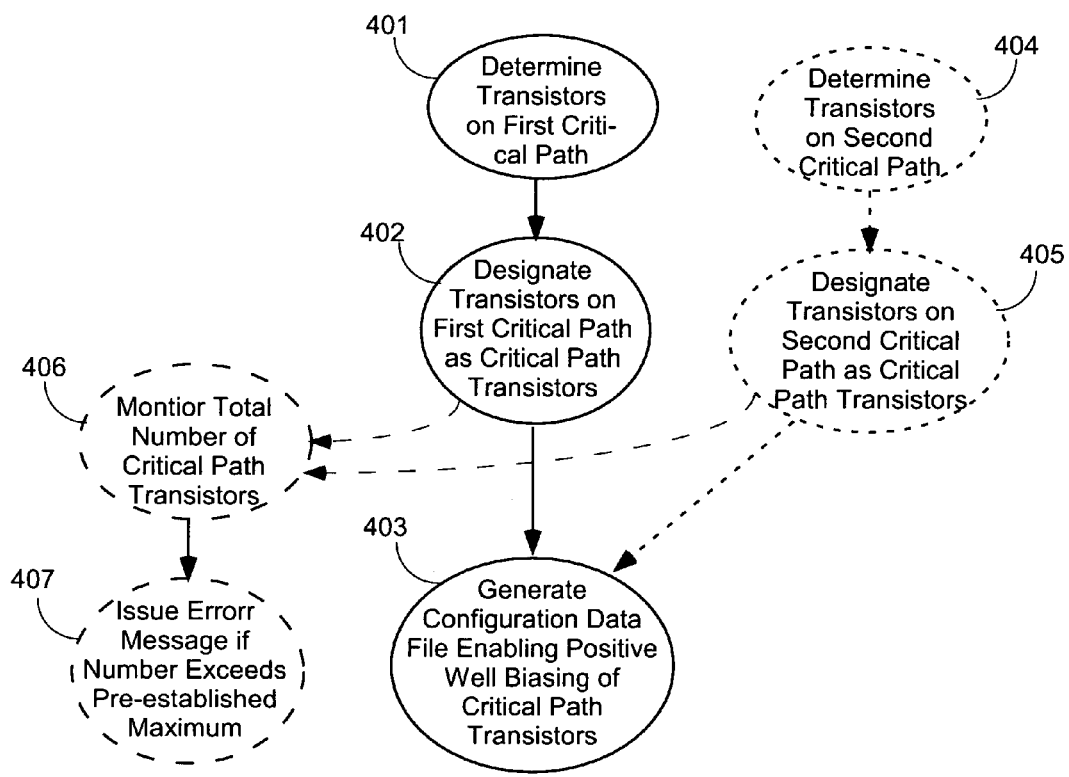
FIG. 4 shows a first method of implementing a PLD in accordance with the present invention.

FIG. 4 shows a first embodiment of the invention. In step 401, the transistors in a first critical path of the user design are determined. In step 402, each transistor on the critical path is identified. In one embodiment, each transistor reference in the design file is "tagged" with an identifier identifying the transistor as a critical path transistor. In step 403, a configuration file is generated, where the configuration file includes information enabling positive well biasing on the transistors identified as critical path transistors.

In an optional series of steps that can occur simultaneously with steps 401 and 402, transistors on a second critical path are similarly determined (step 404) and identified (step 405). In this embodiment, the configuration data file enables positive well biasing for transistors on both critical paths.

In another optional series of steps, the number of critical path transistors is monitored (step 406), to avoid increasing the leakage current of the PLD to an unacceptable level. If the number of critical path transistors exceeds a predetermined acceptable number, an error or warning message is issued to the user.

Figure 5:
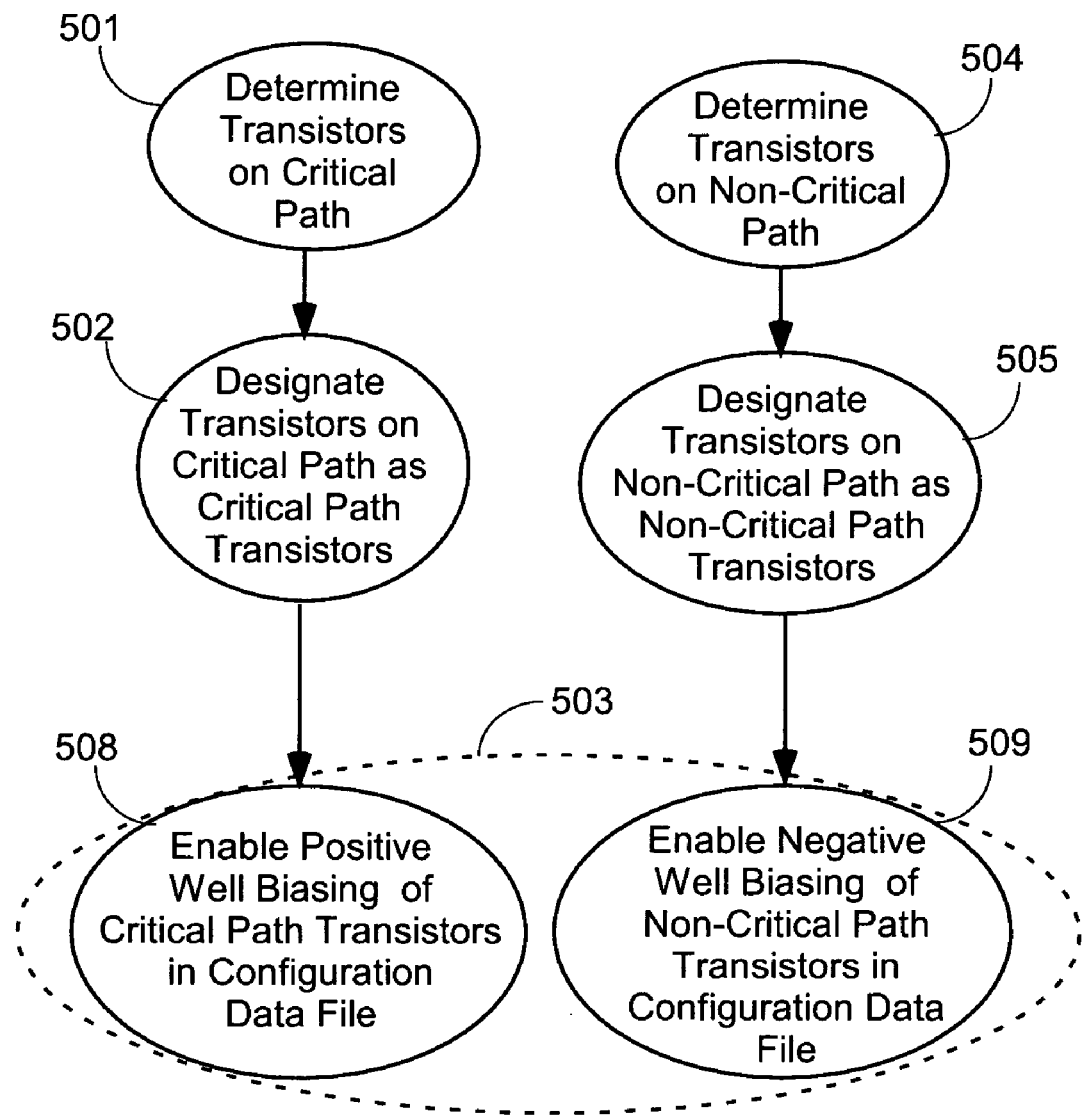
FIG. 5 shows a second method of implementing a PLD in accordance with the present invention.

FIG. 5 shows a second embodiment of the invention. In step 501, the transistors in a critical path of the user design are determined. In step 502, each transistor on the critical path is identified. In a series of steps that can occur simultaneously with steps 501 and 502, transistors on a non-critical path are also determined (step 504) and identified (step 505). In step 503, a configuration file is generated, where the configuration data file includes information enabling positive well biasing on the transistors identified as critical path transistors (508), and further enabling negative well biasing on the transistors identified as non-critical path transistors (509).

A transistor may be part of both the critical path and the non-critical path, for example, a transistor in CLB CLB21 of FIG. 3. In that case, the transistor is preferably treated as a critical path transistor.

Figure 6:
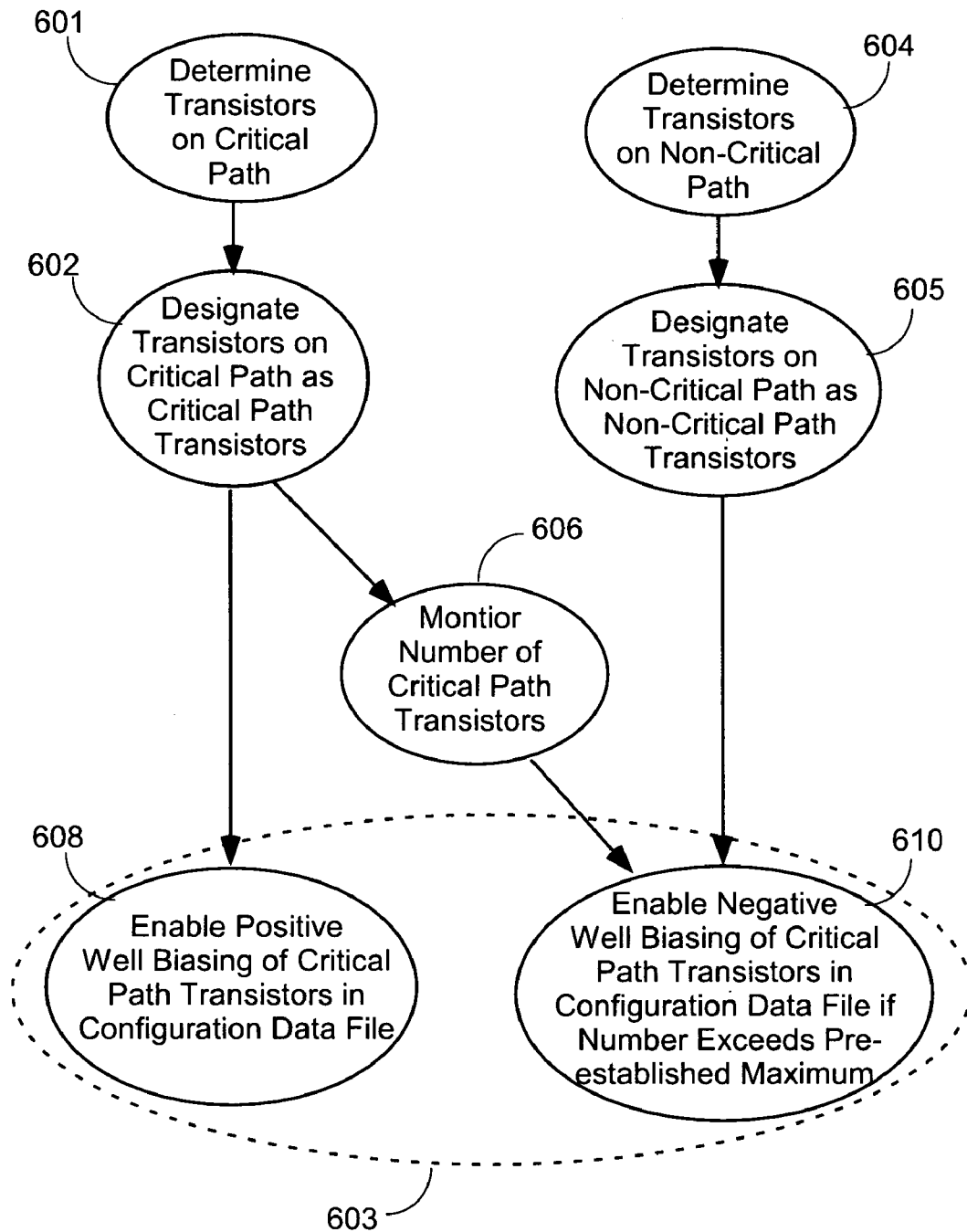
FIG. 6 shows a third method of implementing a PLD in accordance with the present invention.

The embodiment shown in FIG. 6 is similar to the embodiment of FIG. 5, except that the number of transistors on the critical path is monitored (step 606), and negative well biasing for transistors on the non-critical path is only enabled if the number of critical path transistors exceeds a predetermined number.

Figure 7:
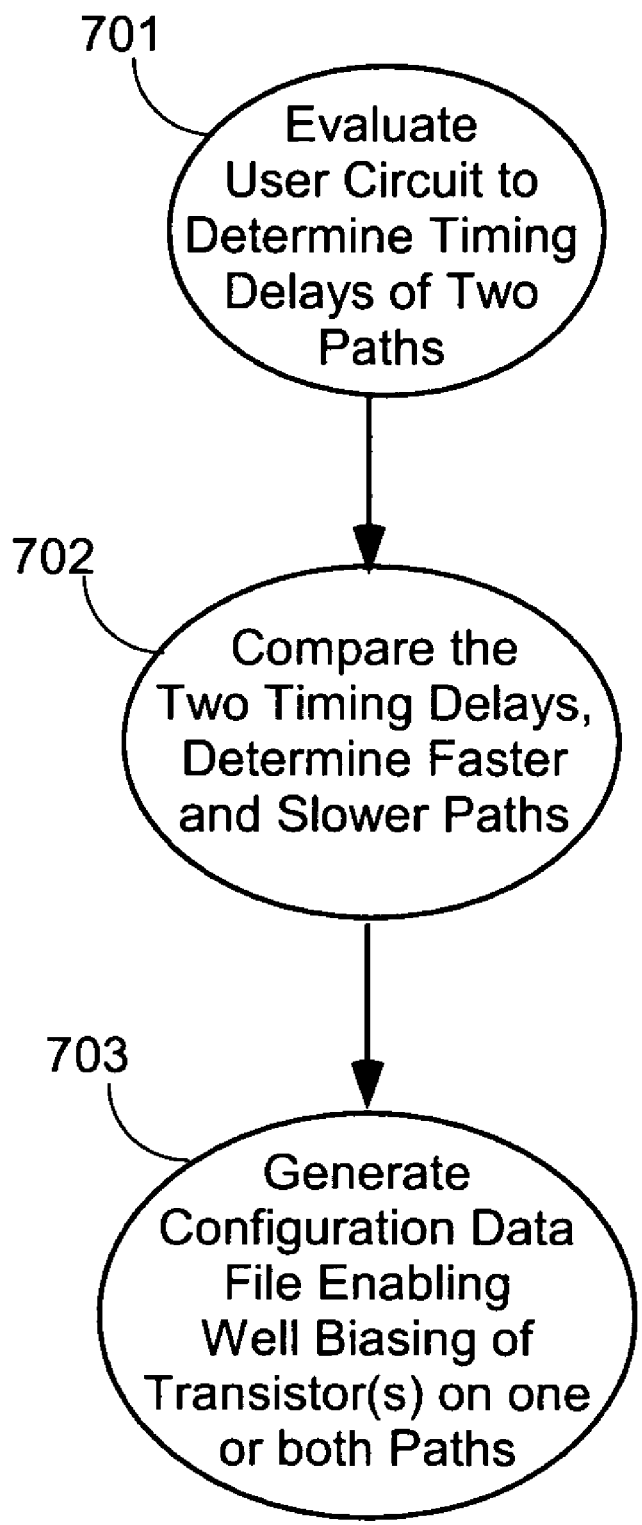
FIG. 7 shows a fourth method of implementing a PLD in accordance with the present invention.

FIG. 7 shows a fourth embodiment of the invention. In step 701, a user circuit is evaluated to determine the timing delays of two paths. In step 702, the two timing delays are compared, and a faster path and a slower path are determined. In step 703, a configuration data file is generated, where the configuration data file enables well biasing (either positive or negative well biasing, or both) on at least one transistor on at least one of the paths.

Figure 8:
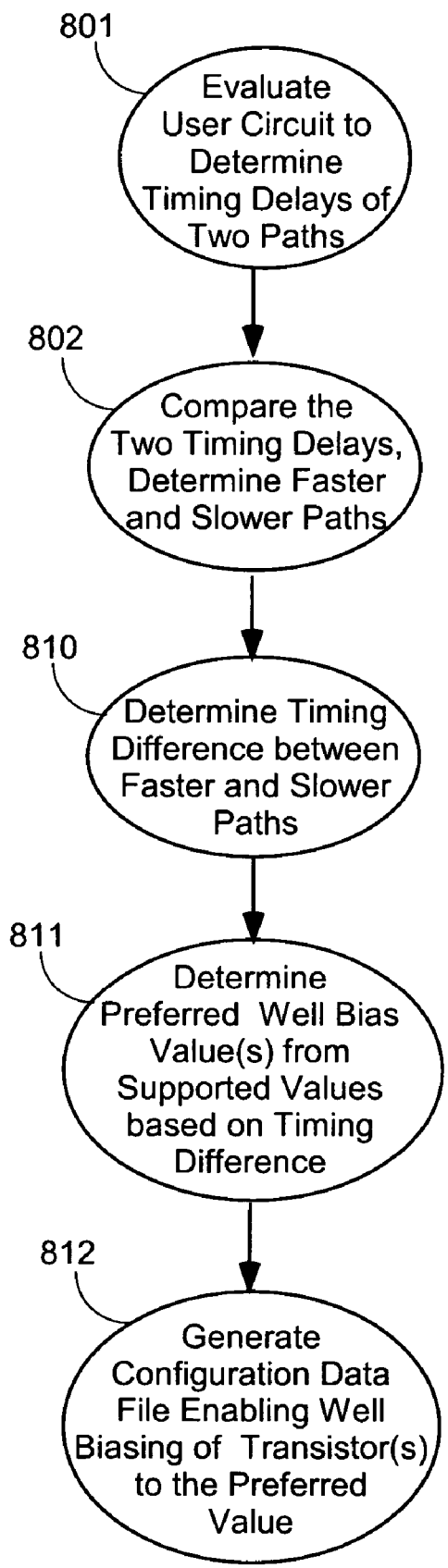
FIG. 8 shows a fifth method of implementing a PLD in accordance with the present invention.

The embodiment of FIG. 8 is similar to that of FIG. 7, except that after the faster and slower paths are determined (step 802), a timing difference between the two paths is determined, e.g., by subtracting the timing delay of the faster path from the timing delay of the slower path (step 810). Based on this timing difference, a preferred well bias value is selected from among a group of available well bias voltage values (step 811). These values are those supported by the voltage generator circuit providing the well bias to each transistor. As previously described, such a circuit can select from among, for example, four available values based on two logic values stored in two configuration memory cells of an FPGA. In step 812, a configuration data file is generated, where the configuration data file enables well biasing to the preferred value on at least one transistor on at least one of the paths.

Figure 9:
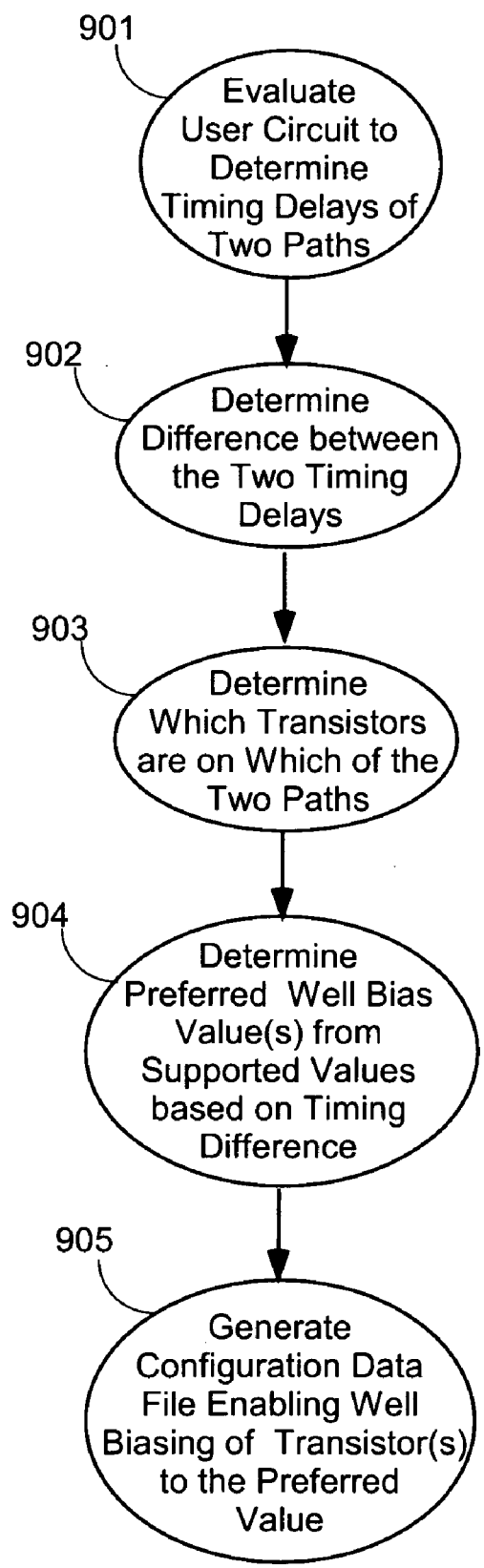
FIG. 9 shows a sixth method of implementing a PLD in accordance with the present invention.

FIG. 9 shows a sixth embodiment of the invention. In step 901, a user circuit is evaluated to determine the timing delays of two paths. In step 902, the difference between the two timing delays is determined. In step 903, it is determined on which path each transistor belongs. As previously described, a transistor on both paths is preferably treated as belonging to the slower of the two paths. (The order of steps 902 and 903 can be reversed.) In step 904, based on the determined timing difference and the path to which each transistor belongs, a preferred well bias value is selected from among a group of available well bias voltage values. In step 905, a configuration data file is generated, where the configuration data file enables well biasing to the preferred value on at least one transistor on at least one of the paths.

Figure 10:
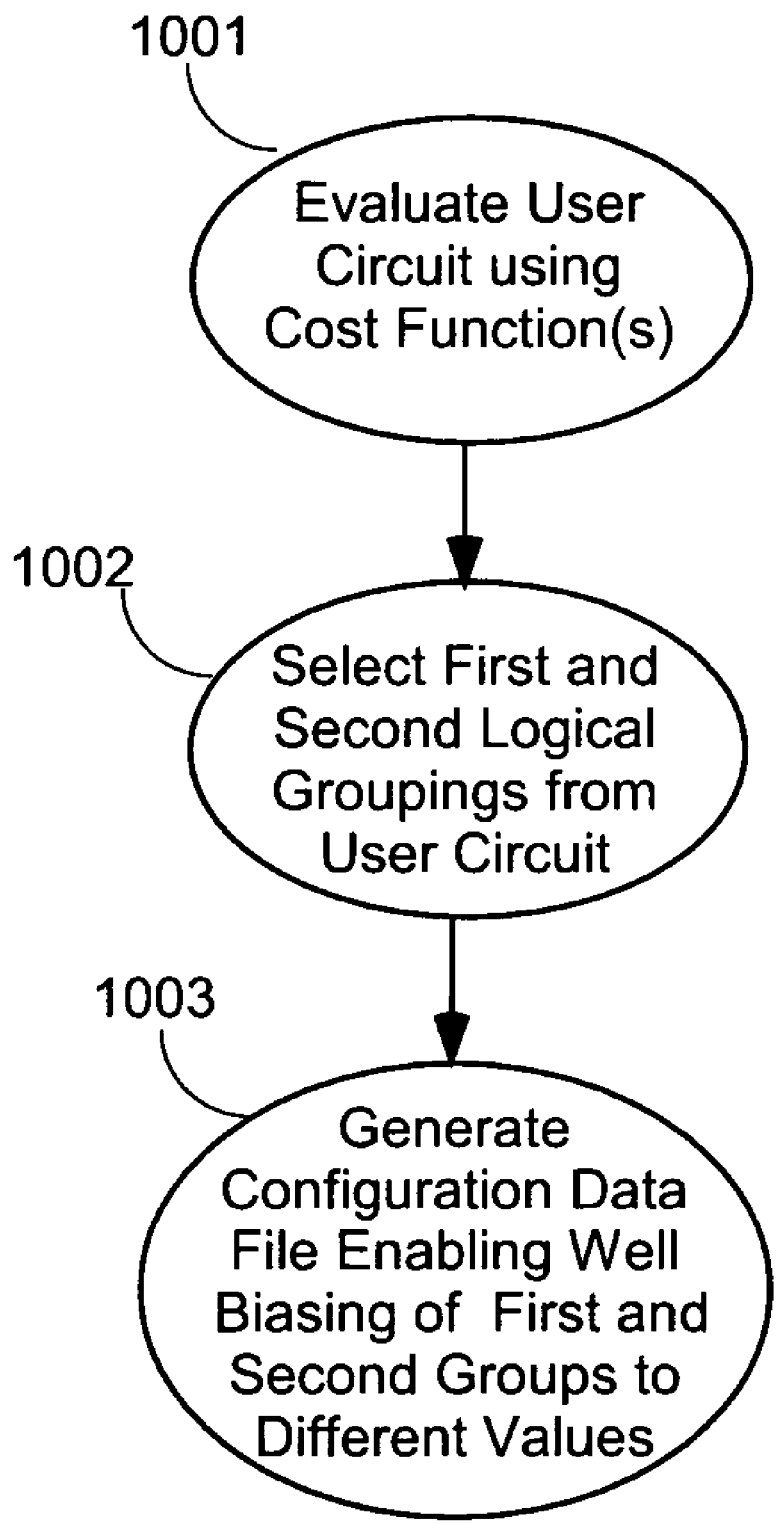
FIG. 10 shows a seventh method of implementing a PLD in accordance with the present invention.

FIG. 10 shows a seventh embodiment of the invention. In step 1001, a user circuit is evaluated based on cost criteria that may include, for example, the increased speed gained by applying a positive well bias, the increased leakage current resulting from a positive well bias, the decreased speed resulting from an applied negative well bias, the decreased leakage current from the applied negative well bias, and other power consumption issues such as the leakage current from wiring among the various elements of the user circuit.

In step 1002, first and second logical groupings are selected from the user circuit, based on the evaluation performed in step 1001. (In some embodiments, steps 1001 and 1002 are performed concurrently.) In step 1003, a configuration data file is generated, where the configuration data file enables well biasing to a first value in the first grouping and to a second value in the second grouping.

In one embodiment, the first grouping has an applied positive bias, while the second grouping has no applied bias. In another embodiment, the first grouping has an applied negative bias, while the second grouping has no applied bias. In yet another embodiment, the groupings both have positive applied biases, but of different values, and so forth. Many other variations are possible using this embodiment of the invention, and will be obvious to those of ordinary skill in the art based on the disclosure herein.

Those having skill in the relevant arts of the invention will now perceive various modifications and additions that may be made as a result of the disclosure herein. For example, the above text describes the structures and methods of the invention in the context of FPGAs implemented using CMOS transistors on a silicon substrate. However, the invention can also be applied to other programmable logic devices, including devices implemented on other substrates and in other types of logic, including but not limited to NMOS, PMOS, bipolar, and so forth. Further, charge pumps, programmable voltage generators, memory cells, transistors, substrates, N-wells and P-wells, and configuration data files other than those described herein can be used to implement the invention. Further, the methods of the present invention are preferably performed by computer software, but the invention is not limited thereto. Accordingly, all such modifications and additions are deemed to be within the scope of the invention, which is to be limited only by the appended claims and their equivalents.

What is claimed is:

1. A method of implementing a user circuit in a programmable logic device (PLD), comprising:
   selecting a first logical grouping from the user circuit;
   selecting a second logical grouping from the user circuit; and
   generating a configuration data file enabling a first level of well biasing for the first logical grouping and a second level of well biasing for the second logical grouping.

2. The method of claim 1, wherein:
the first level of well biasing is a positive well bias; and
the second level of well biasing is no applied well bias.

3. The method of claim 1, wherein:
the first level of well biasing is a negative well bias; and
the second level of well biasing is no applied well bias.

4. The method of claim 1, wherein:
the first level of well biasing is a positive well bias; and
the second level of well biasing is a negative well bias.

5. The method of claim 1, wherein:
the first and second levels of well biasing are of the same polarity but different values.

6. The method of claim 1, wherein the second logic grouping comprises all portions of the user circuit not included in the first logical grouping.

7. A method of implementing a user circuit in a programmable logic device (PLD), comprising:
determining a first set of transistors in the user circuit; and
generating a configuration data file enabling positive well biasing of the first set of transistors.

8. The method of claim 7, wherein the first set of transistors comprises a critical path in the user circuit.

9. The method of claim 7, further comprising determining, prior to generating the configuration data file, a second set of transistors in the user circuit; and wherein:
the configuration data file further enables negative well biasing of the second set of transistors.

10. The method of claim 9, wherein the first set of transistors comprises a critical path in the user circuit, and the second set of transistors comprises a non-critical path in the user circuit.

11. The method of claim 7, further comprising determining, prior to generating the configuration data file, a second set of transistors in the user circuit; and wherein:
the configuration data file further enables positive well biasing of the second set of transistors.

12. The method of claim 11, wherein the first set of transistors comprises a first critical path in the user circuit, and the second set of transistors comprises a second critical path in the user circuit.

13. The method of claim 11, further comprising:
monitoring a total number of the transistors in the first and second sets of transistors; and
issuing an error message if the number exceeds a pre-established maximum.

14. The method of claim 7, wherein:
the PLD is a field programmable gate array (FPGA); and
the configuration data file is an FPGA bitstream.

15. A method of implementing a user circuit in a programmable logic device (PLD), comprising:
determining a first set of transistors in the user circuit; and
generating a configuration data file enabling negative well biasing of the first set of transistors.

16. The method of claim 15, wherein the first set of transistors comprises a non-critical path in the user circuit.

17. The method of claim 15, further comprising determining, prior to generating the configuration data file, a second set of transistors in the user circuit; and wherein:
the configuration data file further enables negative well biasing of the second set of transistors.

18. The method of claim 17, wherein the first set of transistors comprises a first non-critical path in the user circuit, and the second set of transistors comprises a second non-critical path in the user circuit.

19. The method of claim 17, further comprising:
monitoring a total number of the transistors in the first and second sets of transistors; and issuing an error message if the number exceeds a pre-established maximum.

20. The method of claim 15, wherein:
the PLD is a field programmable gate array (FPGA); and
the configuration data file is an FPGA bitstream.

* * * * *